United States Patent [19]
Han et al.

[11] Patent Number: 5,796,126
[45] Date of Patent: Aug. 18, 1998

[54] HYBRID SCHOTTKY INJECTION FIELD EFFECT TRANSISTOR

[75] Inventors: Min-Koo Han; Yearn-Ik Choi, both of Seoul; Jae-Hyung Kim, Kwangjoo; Han-Soo Kim, Seoul, all of Rep. of Korea

[73] Assignee: Samsung Electronics Co., Ltd., Kyungki-Do, Rep. of Korea

[21] Appl. No.: 623,768

[22] Filed: Mar. 29, 1996

[30] Foreign Application Priority Data

Jun. 14, 1995 [KR] Rep. of Korea .................. 15732

[51] Int. Cl.$^6$ ........................................... H01L 29/74
[52] U.S. Cl. .................. 257/141; 257/155; 257/162; 257/170; 257/347
[58] Field of Search .................. 257/134, 141, 257/155, 162, 168, 170, 491, 492, 493, 347

[56] References Cited

U.S. PATENT DOCUMENTS

Re. 33,209  5/1990  Plummer ...................... 257/141

OTHER PUBLICATIONS

Han–Soo Kim, Jae–Hyung Kim, Byeong–Hoon Lee, Min–Koo Han, Seung Youp Han, Yearn–Ik Choi, Sang–Koo Chung, "The Modified HSINFET Using the Trenched JBS Injector", International Power Semiconductor Device & ICs Symposium, 24 May 1995.

*Primary Examiner*—Minh-Loan Tran
*Attorney, Agent, or Firm*—Cushman Darby & Cushman IP Group of Pillsbury Madison & Sutro LLP

[57] ABSTRACT

A hybrid schottky injection field effect transistor is provided. A first diffusion region of a second conductivity type and a second diffusion region of a first conductivity type are separately formed at a main surface of a silicon layer. A third diffusion region of a first conductivity type is formed within the first diffusion region. An insulating layer covers part of the second diffusion region and the third diffusion region. A gate electrode is formed on the insulating layer and is situated over the first and third diffusion regions and the silicon layer. A cathode electrode is commonly connected to the third diffusion region and the first diffusion region. An anode electrode comprises a trench filled with electrode material and is formed in the silicon layer along side of the second diffusion area and a gate insulating layer.

10 Claims, 5 Drawing Sheets

HYBRID SCHOTTKY INJECTION FIELD EFFECT TRANSISTOR

BACKGROUND OF THE INVENTION

The present invention relates to a hybrid schottky injection field effect transistor (hereinafter, called HSINFET), and more particularly to a modified HSINFET with a trench structure.

A lateral insulated gate bipolar transistor (hereinafter, called LIGBT) which is widely used as a power element, is obtained by joining MOS and bipolar transistors. The LIGBT is an excellent power element because it has the on/off control facility of the MOS transistor and the current transmission capability of the bipolar transistor. In addition, the LIGBT is widely used for high power IC applications because of its high current conduction and high forward blocking voltage. It is well known that the switching speed of the LIGBT is rather slow due to a large injected minority carrier and that its gate control becomes lost when a latch-up phenomenon occurs. A schottky injection field effect transistor (hereinafter, called SINFET) with the schottky injector through use of a schottky contact, has a high switching speed and a high forward voltage drop because the amount of injected minority carriers in the SINFET is much less than that of the LIGBT.

The conventional HSINFET provides a high current handling capability and maintains a comparable switching speed. But the forward conduction current through the p-n junction injector is clamped by the schottky contact injector. Therefore, the forward characteristics of the HSINFET depends on the geometry of the anode structure such as the ratio of a schottky junction region to the p-n junction region.

Some recent semiconductor elements utilize a SOI (Silicon On Insulator) substrate having an epi-layer as a bulk region, which enhances the reliability and operating speed of the element. In such semiconductor elements, the epi-layer is separated from the lower semiconductor substrate by means of an insulator. Such a semiconductor element enjoys a heightened degree of integration. In addition, a semiconductor element using an SOI substrate has an excellent dielectric isolation. Therefore, if a power IC element is formed on an SOI substrate, its switching speed can be enhanced and it becomes possible to separate a low voltage general logic circuit from the power element. Accordingly, the SOI substrate can be used as a substrate of the HSINFET.

FIG. 1 is a cross-sectional view of a conventional HSINFET 100. FIG. 2 is a simplified diagram which corresponds to FIG. 1 and illustrates the relative size and positions of the various components of the device illustrated in FIG. 1. FIG. 2 illustrates the positions and the dimensions of various elements of the conventional HSINFET 100 in relation to orthogonal axes, each extending from the lower left corner of the illustrated conventional HSINFET 100. Referring to FIGS. 1 and 2, the illustrated conventional HSINFET 100 includes a SOI (Silicon On Insulator) substrate 3 stacked over a lower semiconductor substrate 1, but separated from the lower semiconductor substrate 1 by an insulating layer 2. A first diffusion area 5 of a second conductivity type (p-type in the specific HSINFET illustrated in FIGS. 1 and 2) is diffused to a depth of 4 μm into a part of silicon epi-layer 3, i.e., into the SOI substrate. The SOI substrate is of the first conductivity type (n-type in the illustrated device). A third diffusion area 7 of the first conductivity type (n-type in the illustrated device) is diffused into the first diffusion area 5 to a depth of 1 μm. Thereafter, a second diffusion area 9 of the first conductivity type (n-type) is diffused into silicon epi-layer 3 at an end of silicon epi-layer 3 which is opposite to the end at which the third diffusion area 7 is located. More specifically, second diffusion area 9 is diffused into silicon epi-layer 3 at a location which is up to 25 μm from an end of a channel which is formed within third diffusion area 7. The end of the channel formed within third diffusion area 7 is identified with a reference line "a" in FIG. 2. An insulator 11 is formed using an oxide process on first diffusion region 5, third diffusion area 7 and silicon epi-layer 3.

Insulator 11 is etched in order to form a predetermined shape as indicated in the cross-sectional view of FIG. 1, and several electrodes are placed thereon including a cathode electrode 13, a gate electrode 15, and an anode electrode 17. A cathode electrode 13 is formed to have a thickness of 5 μm on both a part of third diffusion region 7 and a part of first diffusion region 5. Gate electrode 15 is formed at a central location of the illustrated conventional HSINFET 100. More specifically, gate electrode 15 is formed on an insulator 11 and has a thickness of 2.5 μm and is generally situated over portions of third diffusion area 7, first diffusion area 5, and silicon epi-layer 3. Part of anode electrode 17 is formed on insulator 11 as well as on an end portion of silicon epi-layer 3 and on second diffusion region 9. A left side of anode electrode 17 is situated approximately 15 μm from the end of the channel, i.e., from reference line a as shown in FIG. 2, and a right or distant end of anode electrode 17 is approximately 25 μm from the end of the channel. Anode electrode 17 comprises a contact window portion, having a first side which is approximately 20 μm from the end of the channel and a second more distant side which is approximately 23 μm from the end of the channel. The contact window portion makes contact at its boundaries with a schottky contact 10 as well as portions of silicon epi-layer 3.

The illustrated conventional HSINFET 100 has an excellent turn-off time in comparison with the insulated gate bipolar transistor (hereinafter, called IGBT), because only one HSINFET has an electron current path passing through the schottky contact in the turn-off time among the MOS gate elements having the anode electrode 17 with the schottky contact. Therefore, the electron current generated in the third diffusion area 5 of the first conductivity type (n-type) flows into the schottky contact 10 formed on the anode electrode 17 through a channel beneath the MOS gate and the silicon epi-layer 3 of the first conductivity type to thereby have a faster turn-off time. On the other hand, the turn-off time of the IGBT is slower than that of the HSINFET since the above electron path with the schottky contact 10 is not formed in the IGBT.

As shown in FIG. 1, the conventional HSINFET 100 includes a first diffusion region 5 of the second conductivity (p-type) formed on the SOI substrate, i.e., silicon epi-layer 3, which is of the first conductivity (n-type); and third diffusion region 7 of the first conductivity type (n-type) is formed within first diffusion region 5. Thereafter, second diffusion region 9 of the second conductivity type is formed within silicon epi-layer 3, separated by a predetermined distance from the first diffusion area 5. Then, electrodes are formed, including gate electrode 15 and cathode electrode 13. Gate electrode 15 is formed on insulator 11 situated over third diffusion area 7, first diffusion area 5, and silicon epi-layer 3. Cathode electrode 13 is in contact with third diffusion area 7 and first diffusion area 5. In addition, schottky contact 10 is formed on the bottom of the anode electrode 17 forming a contact between the second diffusion area 9 and the silicon epi-layer 3.

The illustrated conventional HSINFET 100 has a PN junction comprising the schottky contact 10, the silicon epi-layer 3, and the second diffusion area 9. In the illustrated conventional HSINFET 100, the conversion of the forward voltage drop depends on the amount of the minority carriers of the PN junction clamped by the schottky contact 10. Meanwhile, the hole current injected from the PN junction by power applied to the anode electrode 17 is concentrated at cathode electrode 13 through silicon epi-layer 3. At this time, a latch-up can be generated; however, since the P+ doped with the higher thickness is formed in the bottom of the first diffusion area 5, the internal resistance is reduced, thereby preventing the hole current from being latched-up.

Referring to FIG. 5, the illustrated conventional HSINFET 100 has a current limitation numerical value capable of generating a latch-up current which is higher than that of an LIGBT. As shown in FIGS. 5 and 6, the HSINFET is better than the LIGBT in latch-up current characteristics and switching speed, but as shown in FIG. 7, a problem arises in that the illustrated conventional HSINFET provides a higher forward voltage drop than the LIGBT.

SUMMARY OF THE INVENTION

It is therefore an object of the invention to provide a hybrid schottky injection field effect transistor with a reduced forward voltage drop of a silicon epi-layer under a formed trench structure, by changing a geometric structure of an anode electrode, e.g., by changing the ratio of the schottky junction area to the PN junction area Another object of the invention is to provide a hybrid schottky injection field effect transistor with a reduced forward voltage drop by providing a fourth diffusion area of a second conductivity type at the bottom of the trench structure through ion implantation, extending the PN junction area, and causing a large increase in hole current.

Yet another object of the invention is to provide a hybrid schottky injection field effect transistor having a higher current level by improving the forward characteristics thereof without sacrificing the switching speed and the latch-up current.

In order to achieve these objects, the hybrid schottky injection field effect transistor of the present invention is provided with an anode electrode which serves as the trench structure, unlike the conventional HSINFET. The HSINFET of the present invention is also provided with a fourth diffusion area of a second conductivity type (p-type) at the bottom of the trench structure.

According to the present invention, the forward voltage drop of the silicon epi-layer can be reduced by providing an insertion area in the silicon epi-layer when constructing the anode electrode as the trench. In addition, the forward voltage drop may be reduced due to an increase in the hole current through the fourth diffusion area at the bottom of the trench structure.

BRIEF DESCRIPTION OF THE DRAWINGS

The above and other objects, advantages and features of the present invention will be more apparent from the following detailed description taken with the attached drawings, wherein like reference numerals represent similar parts of the present invention throughout the drawings, and wherein.

DETAILED DESCRIPTION OF THE EXEMPLARY EMBODIMENTS

Figure 3:
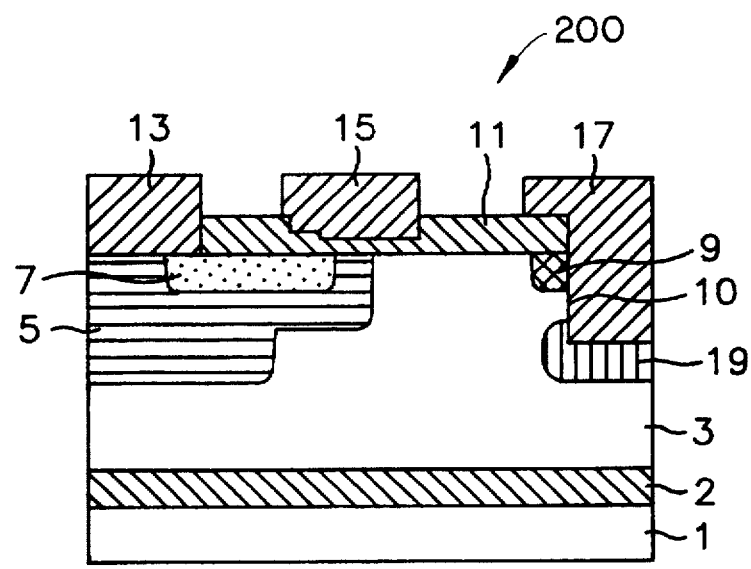
FIG. 3 illustrates a hybrid schottky injection field effect transistor according to the present invention.

Referring now to the drawings in greater detail, FIG. 3 illustrates an exemplary embodiment of an HSINFET 200 provided in accordance with the present invention. The illustrated HSINFET 200 generally includes a lower semiconductor substrate 1 with an insulating layer 2 and an epi-layer 3 (otherwise referred to as an SOI) successively positioned over lower substrate 1. A first diffusion region 5 is provided at a first side (a left side as viewed in FIG. 3) of epi-layer 3. More specifically, diffusion region 5 is of second conductivity type (for example, a p-type in the illustrated embodiment) may be diffused to a depth of 4 µm from a top surface of silicon epi-layer 3 downward. Silicon epi-layer 3 is of a first conductivity type (an n-type in the illustrated embodiment). The illustrated HSINFET 200 also includes a third diffusion region 7 of the first conductivity type (an n-type in the illustrated embodiment), which may be formed by diffusing the same into first diffusion region 5 from a top surface of first diffusion region 5 downward. Third diffusion region 7 may have a depth of approximately 1 µm, as was the case with the conventional HSINFET 100 described above. The illustrated HSINFET 200 further includes a second diffusion region 9 of the first conductivity type (which is an n-type in the illustrated embodiment). That diffusion region may be formed by diffusing the same into silicon epi-layer 3 at an end of that layer which is opposite to the end at which first and third diffusion regions 5, 7 are located.

Figure 1:
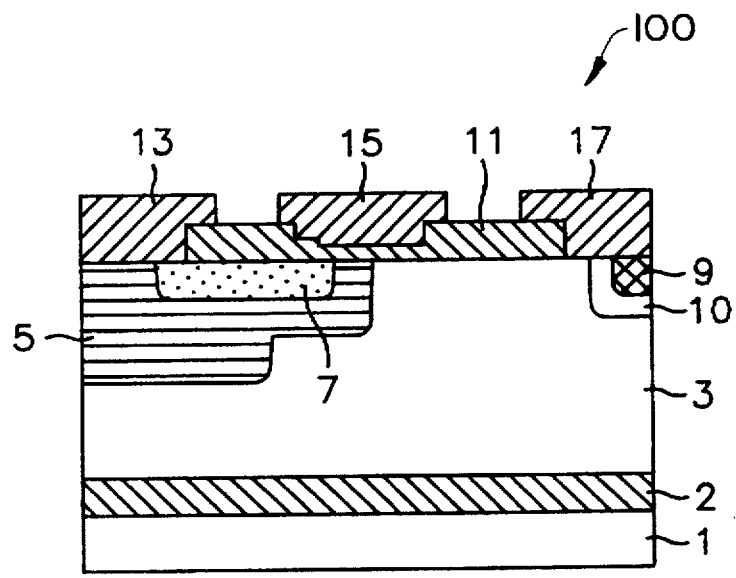
FIG. 1 is a view illustrating a conventional hybrid schottky injection field effect transistor.
Figure 2:
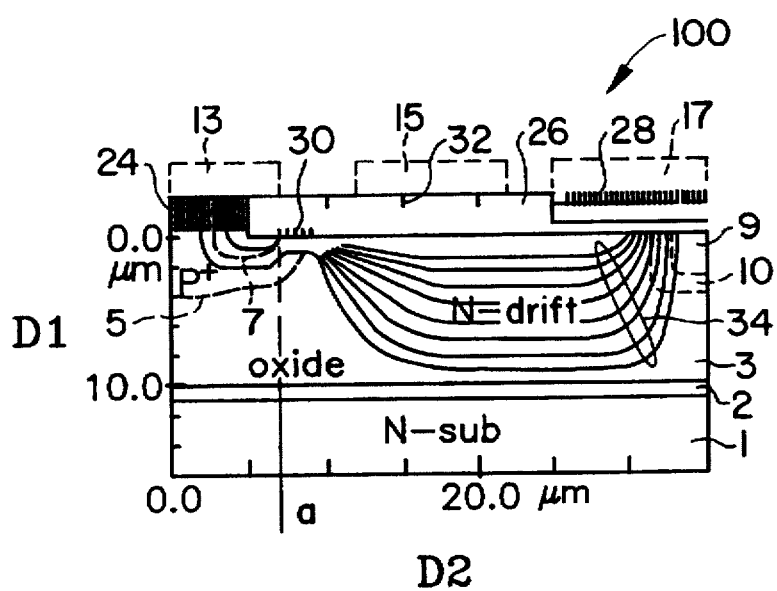
FIG. 2 illustrates a two dimensional simulation of an internal current movement of the device depicted in FIG. 1.

HSINFET 200 further includes an insulating layer 11 with shaped and positioned in a manner similar to the insulator 11 provided in the conventional HSINFET 100 shown in FIG. 1, together with a cathode electrode 13, a gate electrode 15 and an anode electrode 17. Cathode electrode 13 is formed along a side of insulator 11, and is positioned over and in contact with portions (upper surface areas) of first diffusion region 5 and third diffusion region 7. Insulator 11 is substantially elongated in shape and extends at one end from a middle portion of third diffusion region 7 to a position at an outer or right end of second diffusion region 9. Therefore, insulator 11 covers a significant portion of a third diffusion region 7, an inner portion of first diffusion region 5, an upper surface area of epi-layer 3, as well as a complete upper surface of second diffusion region 9. Gate electrode 15 is located substantially directly over a narrow vertical portion of first diffusion region 5 which is at a central location of HSINFET 200. More specifically, gate electrode 15 is formed on insulator 11, and is situated over a portion of third diffusion region 7, first diffusion region 5 and silicon epi-layer 3. Anode electrode 17 comprises an upper portion which extends partially over an end portion of insulator 11, and a vertical portion which extends downward along a side of insulator 11 and a side of second diffusion region 9 and forms a trench structure 22 within silicon epi-layer 3 at an upper right corner portion thereof. The surface at which silicon epi-layer 3 interfaces with anode electrode 17 serves as a schottky contact 10. A fourth diffusion region 19 of the second conductivity type is situated below and partially envelopes a bottom end portion of anode electrode 17, and thus partially envelopes a bottom of trench structure 22. Accordingly, the bottom of trench structure 22 is defined as the bottom surface of anode electrode 17.

Figure 4A:
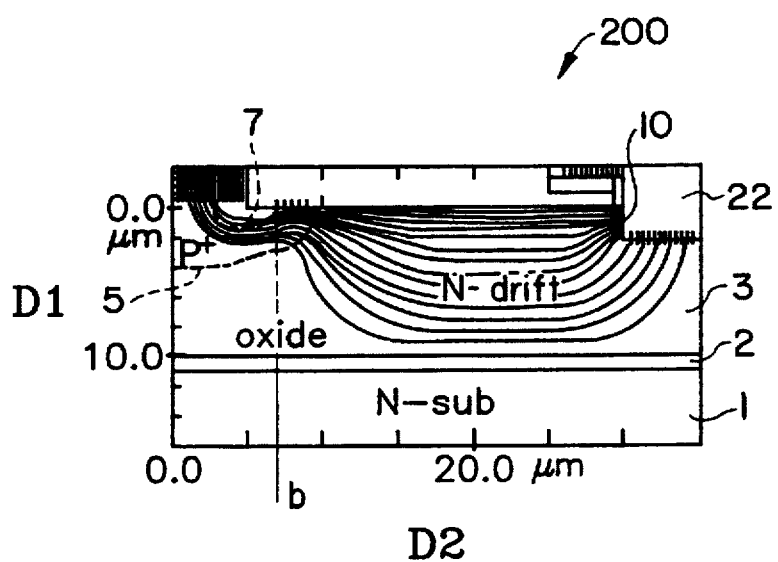
FIG. 4A illustrates a two dimensional simulation of an internal current movement according to one embodiment depicted in FIG. 3.
Figure 4B:
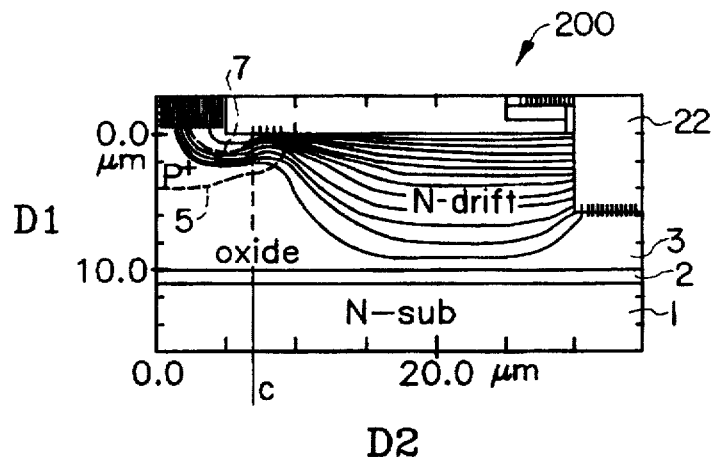
FIG. 4B illustrates a two dimensional simulation of an internal current movement according to another embodiment of the device depicted in FIG. 3.

FIGS. 4A and 4B illustrate the relative positions and dimensions of the various components of the HSINFET 200 of FIG. 3, in accordance with first and second specific exemplary embodiments, respectively. In each of the specific embodiments of FIGS. 4A and 4B, first diffusion region 5 is approximately 4 μm in depth, and third diffusion region 7 is approximately 1 μm in depth. In addition, in each of the specific embodiments, anode electrode 17 is dimensioned and positioned such that a left or inner side thereof is positioned at approximately 23 μm from an end of a channel formed within third diffusion region 7, i.e., from reference line "b" as indicated in FIG. 4A, or from reference line "c" indicated in FIG. 4B. A right or outer side of anode electrode 17 is located at a position which is approximately 28 μm from the reference lines "b" and "c" in FIGS. 4A and 4B, respectively.

FIGS. 4A and 4B also show the current flow changes within the various regions when a positive bias voltage is applied to gate electrode 15 of the illustrated HSINFET 200. FIG. 4A therefore shows a specific embodiment of an HSINFET 200, with a bias voltage being applied. The HSINFET 200 illustrated in FIG. 4A comprises a trench structure 22 which is 3 μm in depth from a position corresponding to an uppermost surface of silicon epi-layer which is in contact with a lower surface of insulator 11. As noted above, the bottom of the trench structure 22 is defined as the bottom surface of anode electrode 17. Other than the depth of trench structure 22, the specific embodiments illustrated in FIGS. 4A and 4B are otherwise identical. According to the two-dimensional current simulation depicted in FIG. 4A, electron current flows from a third diffusion region 7 through a first diffusion region 5 and further through an upper region within silicon epi-layer 3 and is concentrated on schottky contact 10. Hole current is injected from fourth diffusion region 19 downward out of the bottom of trench structure 22, flows through silicon epi-layer 3 and first diffusion region 5, and ends up being concentrated on cathode electrode 13.

FIG. 4B illustrates another specific embodiment of an HSINFET 200 of the present invention, with a trench structure which is 7 μm in depth from a position corresponding to an upper surface of silicon epi-layer 3 which interfaces with a bottom surface of insulator 11. As noted above, the structure of the overall HSINFET 200 illustrated in FIG. 4B is otherwise identical to that of FIG. 4A. Since the trench depth is increased in FIG. 4B, the serial resistance between insulating layer 2 and fourth diffusion region 19 is increased, thus reducing the amount of hole current which flows from the bottom of fourth diffusion region 19 through silicon epi-layer 3 and ends up being concentrated on cathode electrode 13. Accordingly, it is difficult for the minority carriers (i.e., the whole current coming out of fourth diffusion region 19) to move toward cathode electrode 13 on the insulator.

Figure 5:
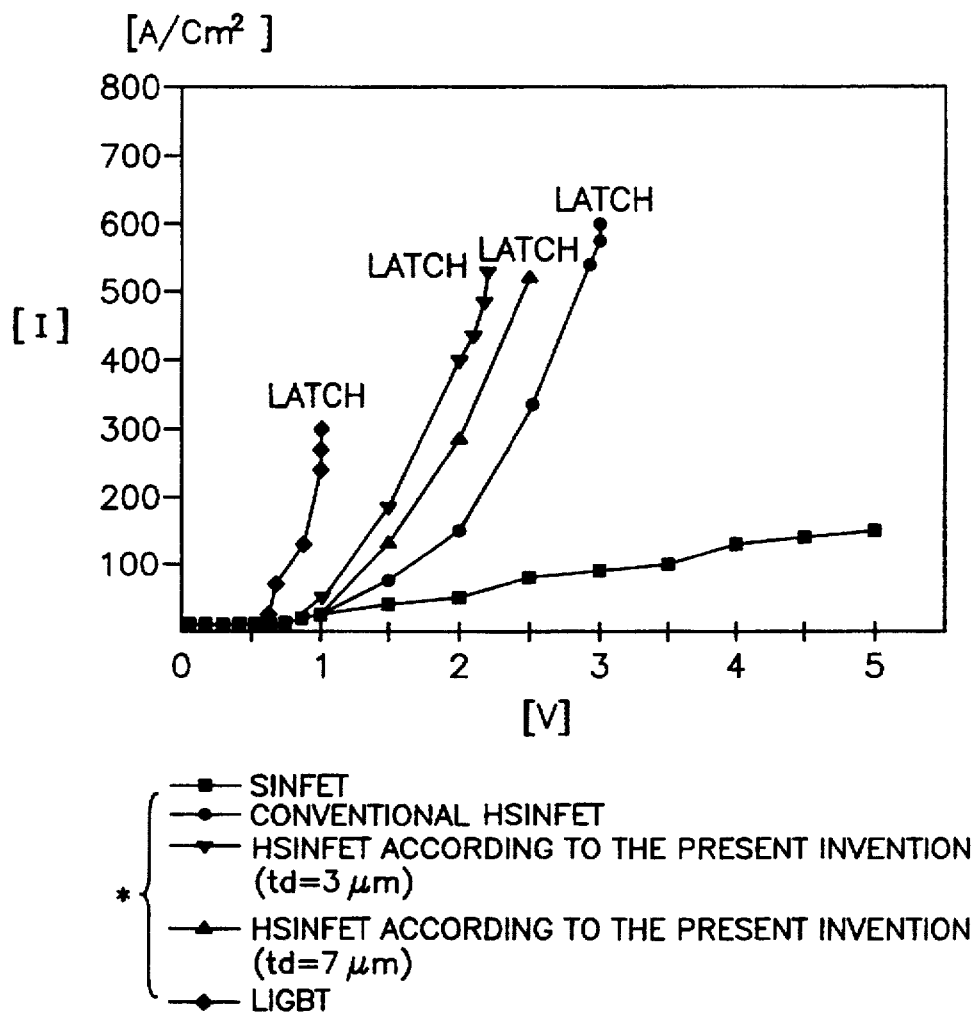
FIG. 5 graphically illustrates an applied voltage in relation to latch-up current for the two embodiments of the present invention and for the conventional HSINFET.

Referring to FIG. 5, the HSINFET of the present invention has a larger latch-up current in relation to an applied anode voltage than the LIGBT. Further, the latch-up current of the present invention HSINFET 200 is somewhat different from the conventional HSINFET 100 and is widely different than that of the SINFET.

Figure 6:
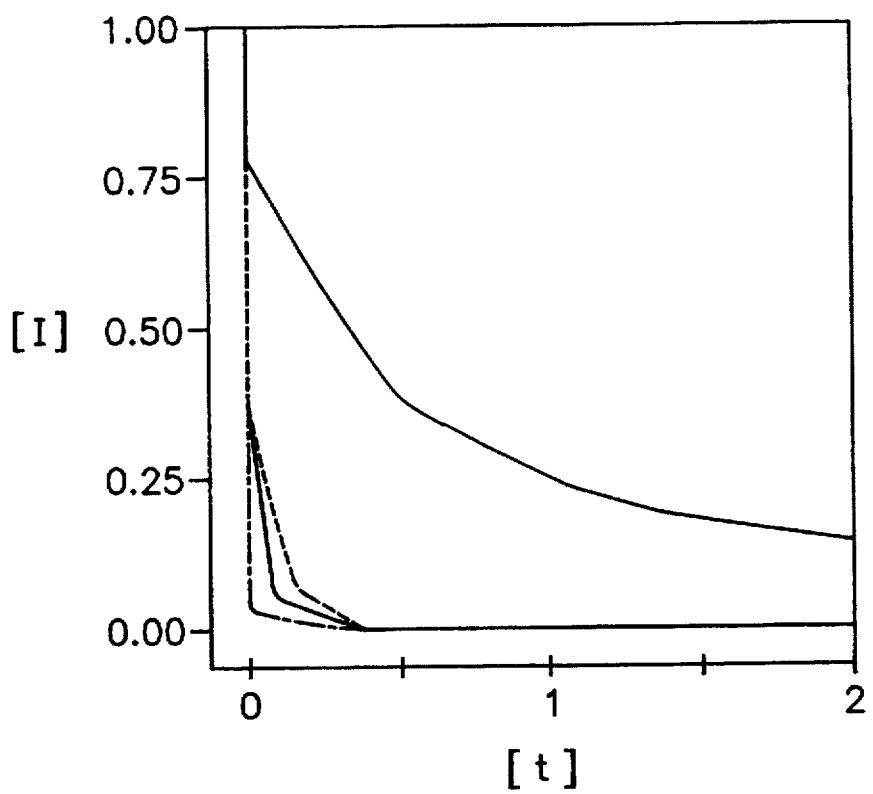
FIG. 6 graphically illustrates an anode current in relation to turn off time for the two embodiments of the present invention and for the conventional HSINFET.

FIG. 6 shows a current value that remains when an applied gate voltage drop is changed to 0 V from 15 V, i.e., when a turned on state is changed to a turned off state.

The HSINFET of the present invention has a turn-off time which is not much different from that of the conventional HSINFET and the SINFET, but which is much faster than the turn-off time of the LIGBT.

Figure 7:
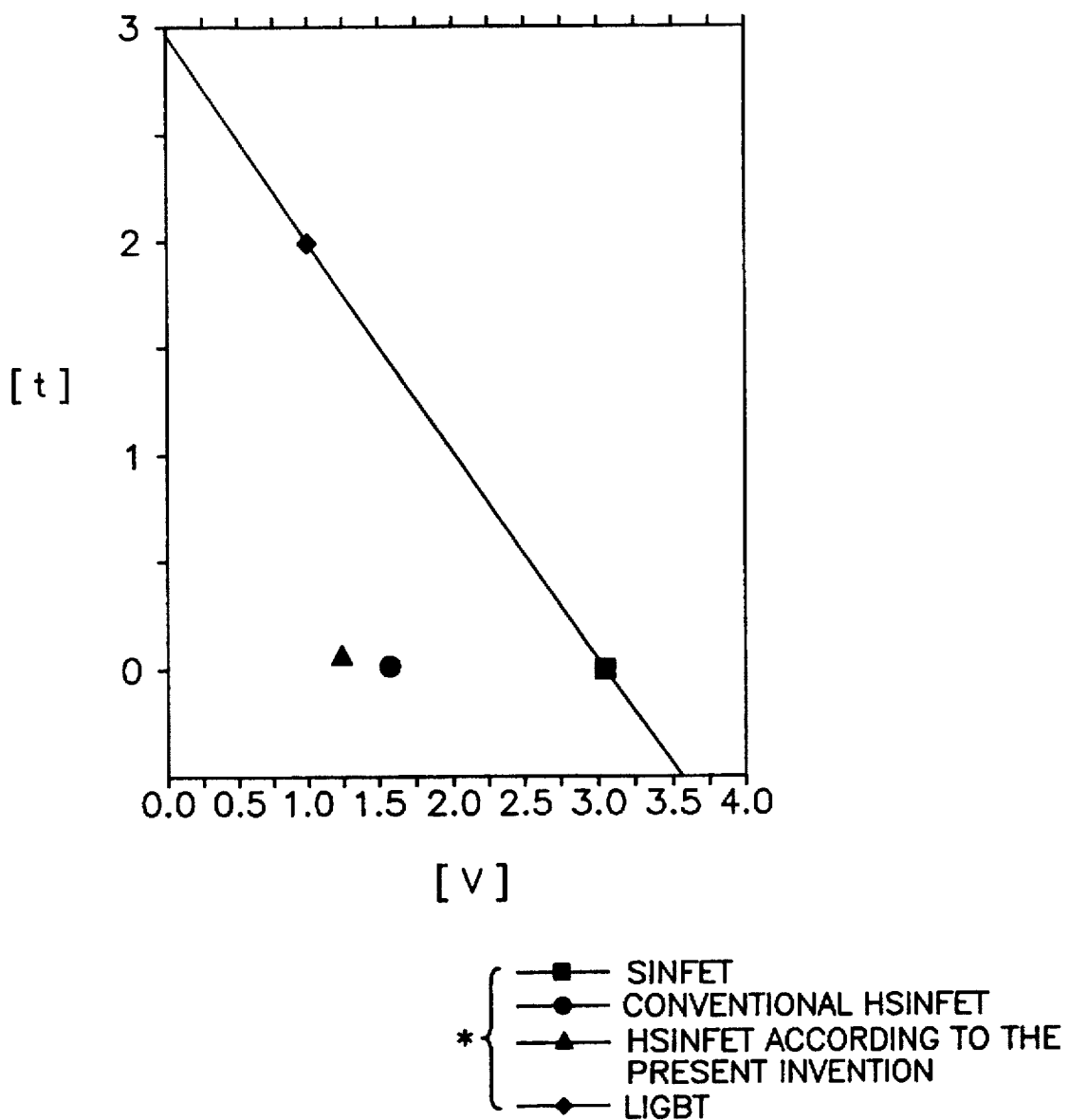
FIG. 7 graphically illustrates a turn off time in relation to a forward voltage drop for the two embodiments of the present invention and for the conventional HSINFET.

Referring to FIG. 7, there is little difference between the turn-off times of the HSINFET of the present invention and of the conventional HSINFET; however, the forward voltage drop of the HSINFET of the present invention is smaller than that of the conventional HSINFET.

Furthermore, in the HSINFET of the present invention, the forward voltage drop can be reduced without sacrificing the switching speed and the latch-up current of the conventional HSINFET. In addition, the HSINFET of the present invention reduces the forward voltage drop without significantly increasing the turn-off time from that of the conventional HSINFET.

The present disclosure is related to a paper by Han-Soo KIM, et al., entitled "The Modified HSINFET Using the Trenched JBS Injector," published at the "International Power Semiconductor Device & ICs Symposium" in Yokohama, on May 24, 1995, the content of which is hereby expressly incorporated by reference herein in its entirety.

In view of the above, one skilled in the art will recognize that the HSINFET of the present invention is intended to reduce the forward voltage drop while maintaining other beneficial qualities of the conventional HSINFET. Therefore, variations may be made to the exemplary embodiments disclosed herein without departing from the spirit or scope of the general inventive concept, e.g., as defined by the appended claims and their equivalents.

What is claimed is:

1. A hybrid schottky injection field effect transistor integrated on a silicon layer of a first conductivity type separated from a semiconductor substrate by an insulator, comprising:

a first diffusion region of a second conductivity type and a second diffusion region of said first conductivity type said first and second diffusion regions being spaced from each other and being formed at a top surface of said silicon layer, said silicon layer comprising a space region disposed between said first and second diffusion regions;

a third diffusion region of said first conductivity type formed within said first diffusion region;

an insulating layer disposed over at least a portion of said silicon layers said second diffusion region and at least a part of said third diffusion region;

a gate electrode formed on said insulating layer at a position directly over at least a part of each of said first and third diffusion regions and said silicon layer;

a cathode electrode commonly connected to said third diffusion region and said first diffusion region; and an anode electrode comprising electrode material which fills a trench having a side wall defined by a portion of each of said silicon layer, said second diffusion region and said insulating layer, whereby electron current of said third diffusion region is concentrated on said anode electrode.

2. The hybrid schottky injection field effect transistor as claimed in claim 1, wherein said second and third diffusion regions are each doped with an n-type impurity, and wherein said first diffusion region is doped with a p-type impurity.

3. A hybrid schottky injection field effect transistor integrated on a SOI (Silicon on Insulator) substrate having a silicon layer of a first conductivity type separated from a semiconductor substrate by means of an insulator, comprising:
- a first diffusion region of a second conductivity type and a second diffusion region of said first conductivity separately formed at a top surface of said silicon layer;
- a third diffusion region of said first conductivity type formed within said first diffusion region;
- an insulating layer formed from over said second diffusion region to over a part of said third diffusion region;
- a gate electrode formed on said insulating layer, situated over at least a part of each of said first and third diffusion regions and said silicon layer;
- a cathode electrode commonly connected to said third diffusion area and said first diffusion area;
- an anode electrode comprising a trench filled with electrode material, said trench being formed along side of a portion of said silicon layers at least part of said second diffusion area and a portion of said insulating layer; and
- a fourth diffusion region of a second conductivity type in contact with said anode electrode and being formed by doping a portion of said silicon layer, whereby electron current originating from said third diffusion area is concentrated on said anode electrode.

4. The hybrid schottky injection field effect transistor as claimed in claim 3, wherein said first to fourth diffusion areas are each doped with at least one of p-type and n-type impurities and said silicon layer is an epi-layer doped with n-type impurity.

5. The hybrid schottky injection field effect transistor as claimed in claim 1, wherein said insulating layer covers an area extending from a top side of said second diffusion region to a middle portion of said third diffusion region.

6. The hybrid schottky injection field effect transistor as claimed in claim 1, further comprising a fourth diffusion region of said second conductivity type.

7. The hybrid schottky injection field effect transistor as claimed in claim 1, wherein said trench is located along a side of said second diffusion region opposite said space region.

8. The hybrid schottky injection field effect transistor as claimed in claim 7, wherein said insulating layer completely covers said space region.

9. The hybrid schottky injection field effect transistor as claimed in claim 8, wherein said gate electrode covers part of said space region.

10. The hybrid schottky injection field effect transistor as claimed in claim 1, wherein said third diffusion region is formed at said top surface of said silicon layer.

* * * * *